(12) United States Patent
Ruiz Larios et al.

(10) Patent No.: US 9,838,009 B2
(45) Date of Patent: Dec. 5, 2017

(54) SWITCH WITH USER FEEDBACK

(71) Applicant: Continental Automotive Systems, Inc., Auburn Hills, MI (US)

(72) Inventors: Carlos Iván Ruiz Larios, Zapopan (MX); Manuel Hernandez Diaz, Zapopan (MX); José Arturo Sánchez López, Guadalajara (MX)

(73) Assignee: Continental Automotive Systems, Inc., Auburn Hills, MI (US)

( * ) Notice: Subject to any disclaimer, the term of this patent is extended or adjusted under 35 U.S.C. 154(b) by 509 days.

(21) Appl. No.: 14/470,371

(22) Filed: Aug. 27, 2014

(65) Prior Publication Data

US 2016/0064166 A1   Mar. 3, 2016

(51) Int. Cl.
| | | |
|---|---|---|
| *H02H 1/00* | (2006.01) | |
| *H03K 17/96* | (2006.01) | |
| *H03K 17/955* | (2006.01) | |

(52) U.S. Cl.
CPC ....... *H03K 17/9645* (2013.01); *H03K 17/962* (2013.01); *H03K 17/955* (2013.01); *H03K 2217/96062* (2013.01)

(58) Field of Classification Search
USPC ....................................................... 307/116
See application file for complete search history.

(56) References Cited

U.S. PATENT DOCUMENTS

| | | | |
|---|---|---|---|
| 4,290,052 A * | 9/1981 | Eichelberger | ........... G06F 3/044 341/33 |
| 5,220,260 A | 6/1993 | Schuler | |
| 5,389,865 A | 2/1995 | Jacobus et al. | |
| 5,414,337 A | 5/1995 | Schuler | |
| 5,459,382 A | 10/1995 | Jacobus et al. | |
| 5,526,294 A * | 6/1996 | Ono | ..................... H03K 17/962 708/143 |
| 5,559,412 A | 9/1996 | Schuler | |
| 5,589,854 A | 12/1996 | Tsai | |
| 5,731,804 A | 3/1998 | Rosenberg | |
| 5,767,839 A | 6/1998 | Rosenberg | |
| 5,923,522 A | 7/1999 | Sajna | |
| 6,020,967 A | 2/2000 | Gregorio et al. | |
| 6,050,718 A | 4/2000 | Schena et al. | |
| 6,088,017 A | 7/2000 | Tremblay et al. | |
| 6,184,868 B1 | 2/2001 | Shohoian et al. | |
| 6,246,390 B1 | 6/2001 | Rosenberg | |
| 6,271,833 B1 | 8/2001 | Rosenberg et al. | |
| 6,275,213 B1 | 8/2001 | Tremblay et al. | |
| 6,281,651 B1 | 8/2001 | Haanpaa et al. | |
| 6,285,351 B1 | 9/2001 | Chang et al. | |
| 6,300,938 B1 | 10/2001 | Culver | |
| 6,374,255 B1 | 4/2002 | Peurach et al. | |
| 6,396,232 B2 | 5/2002 | Haanpaa et al. | |
| 6,411,276 B1 | 6/2002 | Braun et al. | |
| 6,429,846 B2 | 8/2002 | Rosenberg et al. | |
| 6,445,284 B1 | 9/2002 | Cruz-Hernandez et al. | |
| 6,469,692 B2 | 10/2002 | Rosenberg | |
| 6,497,672 B2 | 12/2002 | Kramer | |

(Continued)

*Primary Examiner* — Danny Nguyen

(57) ABSTRACT

A switch includes a substrate that has a contact area on a first face. At least one first conductor is located in the substrate and extends onto the contact area. At least one second conductor is located in the substrate and extends onto the contact area. A sensor is configured to detect when a user contacts the contact area.

16 Claims, 3 Drawing Sheets

(56) References Cited

U.S. PATENT DOCUMENTS

| | | | |
|---|---|---|---|
| 6,563,487 B2 | 5/2003 | Martin et al. | |
| 6,580,417 B2 | 6/2003 | Rosenberg et al. | |
| 6,693,622 B1 | 2/2004 | Shahoian et al. | |
| 6,693,626 B1 | 2/2004 | Rosenberg | |
| 6,697,044 B2 | 2/2004 | Shahoian et al. | |
| 6,715,045 B2 | 3/2004 | Braun et al. | |
| 6,904,823 B2 | 6/2005 | Levin et al. | |
| 6,906,697 B2 | 6/2005 | Rosenberg | |
| 6,928,386 B2 | 8/2005 | Hasser | |
| 6,933,920 B2 | 8/2005 | Lacroix et al. | |
| 6,965,370 B2 | 11/2005 | Gregorio et al. | |
| 6,982,696 B1 | 1/2006 | Shohoian | |
| 9,501,685 B2 * | 11/2016 | Bernstein | G06K 9/0002 |
| 2011/0001722 A1 * | 1/2011 | Newman | G06F 3/03547 |
| | | | 345/174 |
| 2012/0218029 A1 * | 8/2012 | Furuta | H03K 17/962 |
| | | | 327/517 |
| 2013/0200907 A1 * | 8/2013 | Schneider | G06K 9/0002 |
| | | | 324/686 |

\* cited by examiner

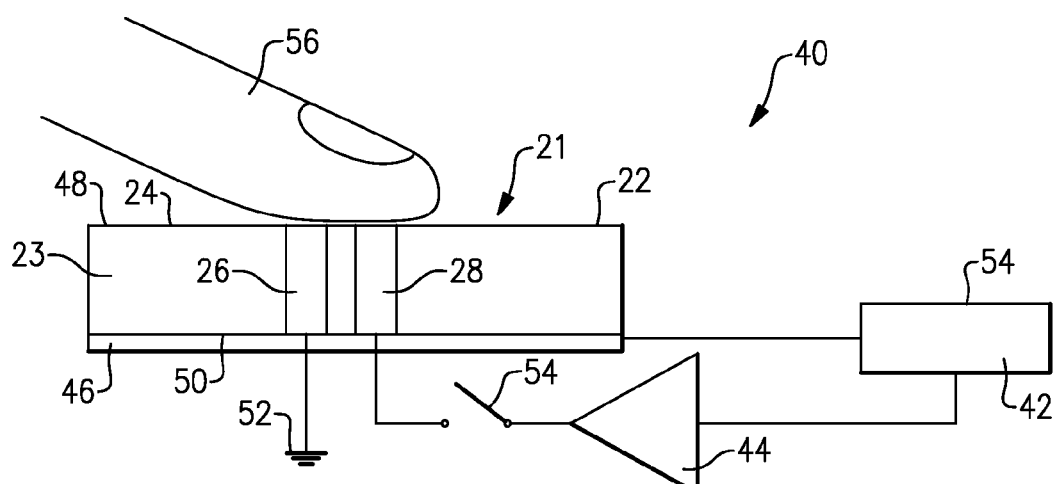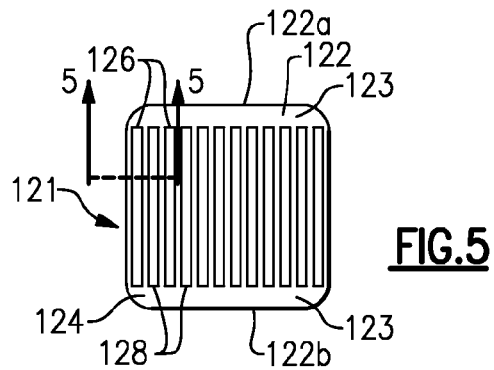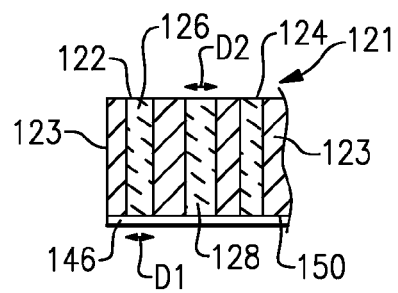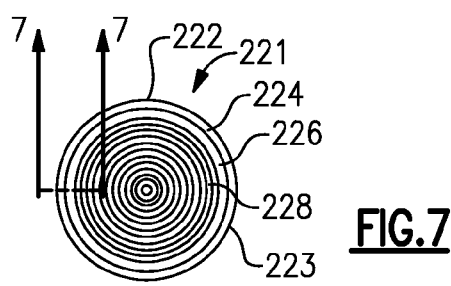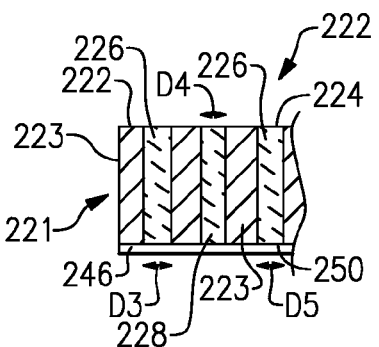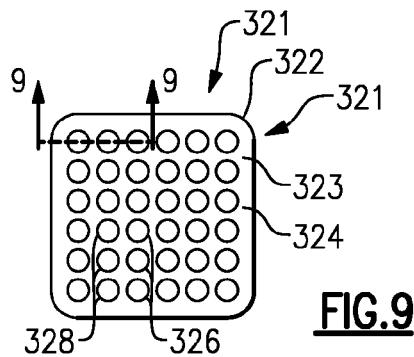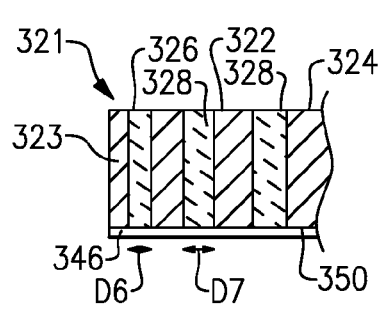

SWITCH WITH USER FEEDBACK

BACKGROUND

The present invention relates to a switch that provides feedback to a user when the user contacts the switch.

A number of approaches have been taken to provide feedback to a user. One approach has been to provide visual feedback, such as a moving a switch between an on and an off position or through the use of a light. However, these approaches require the user to visually observe the switch which might be distracting while the user is performing other tasks.

Audible feedback is another approach taken to provide feedback to the user. With this approach, if the user is in an area surrounded by loud noises, the loud noises might drown out the audible feedback so that the user might be unsure if audible feedback was provided. Additionally, audible feedback requires a significant number of components, such as speakers and wiring.

Mechanical feedback has also been used to provide feedback to the user. With this approach, a mechanical element might contact the user's finger during operation of the switch or the switch may vibrate to signal to the user that the switch has been engaged. However, mechanical feedback requires a significant number of components that can be prone to failure and require repair. Therefore, there is a need for a switch that provides feedback to a user that is not prone to failure and requires the least number of parts.

SUMMARY

In one exemplary embodiment, a switch includes a substrate that has a contact area on a first face. At least one first conductor is located in the substrate and extends onto the contact area. At least one second conductor is located in the substrate and extends onto the contact area. A sensor is configured to detect when a user contacts the contact area.

In another exemplary embodiment, an automotive component includes a plurality of switch assemblies for controlling at least one vehicle parameter. Each of the plurality of switch assemblies includes a substrate that has a contact area on a first face. At least one first conductor is located in the substrate and extends onto the contact area. At least one second conductor is located in the substrate and extends onto the contact area. A sensor is configured to detect when a user contacts the contact area. A microprocessor is in communication with the sensor to determine when a user contacts the contact area.

In another exemplary embodiment, a method of operating a switch includes a) grounding a first conductor located on a contact surface of a button to a ground, b) connecting an electrical power source to a second conductor located on the contact surface of the button, c) determining when a user contacts the button with a sensor, and d) sending an electrical current to the second conductor when the user contacts the button.

These and other features of the disclosed examples can be understood from the following description and the accompanying drawings, which can be briefly described as follows.

BRIEF DESCRIPTION OF THE DRAWINGS

FIG. 4 illustrates a schematic view of a switch assembly.

FIG. 5 illustrates an example switch.

FIG. 6 illustrates a cross-sectional view taken along line 6-6 of FIG. 5.

FIG. 7 illustrates another example switch.

FIG. 8 illustrates a cross-sectional view taken along line 8-8 of FIG. 7.

FIG. 9 illustrates yet another example switch.

FIG. 10 illustrates a cross-sectional view taken along line 10-10 of FIG. 9.

DETAILED DESCRIPTION

Figure 1:
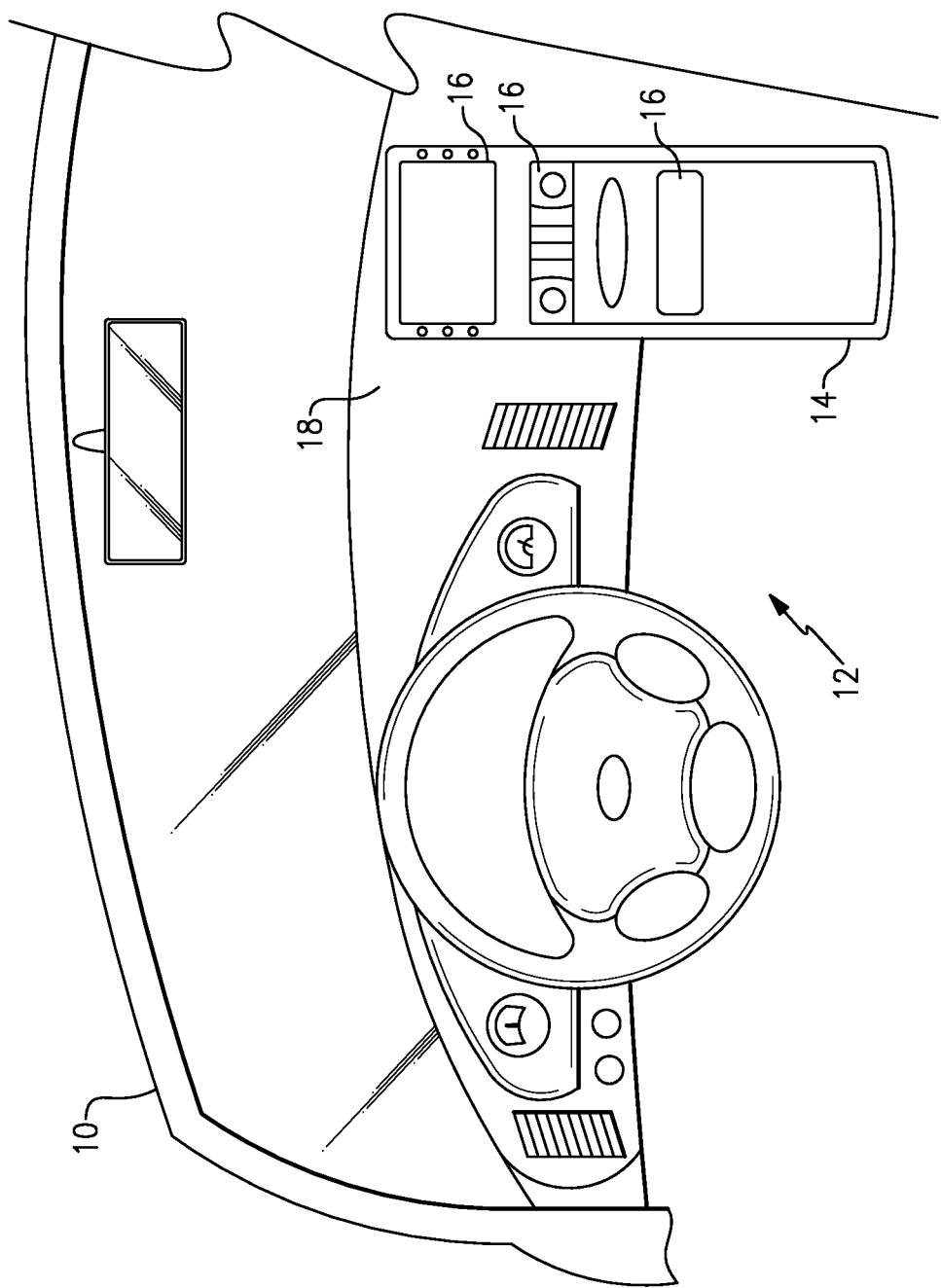
FIG. 1 illustrates an example vehicle interior.

FIG. 1 illustrates an example vehicle 10, such as a passenger or commercial vehicle, having an interior compartment 12. The interior compartment 12 includes a center stack 14 located in a dash 18 in a center of the vehicle 10. The center stack 14 includes multiple example vehicle components 16 for controlling a safety system, a temperature system, an entertainment system, or another parameter in the vehicle 10.

Figure 2:
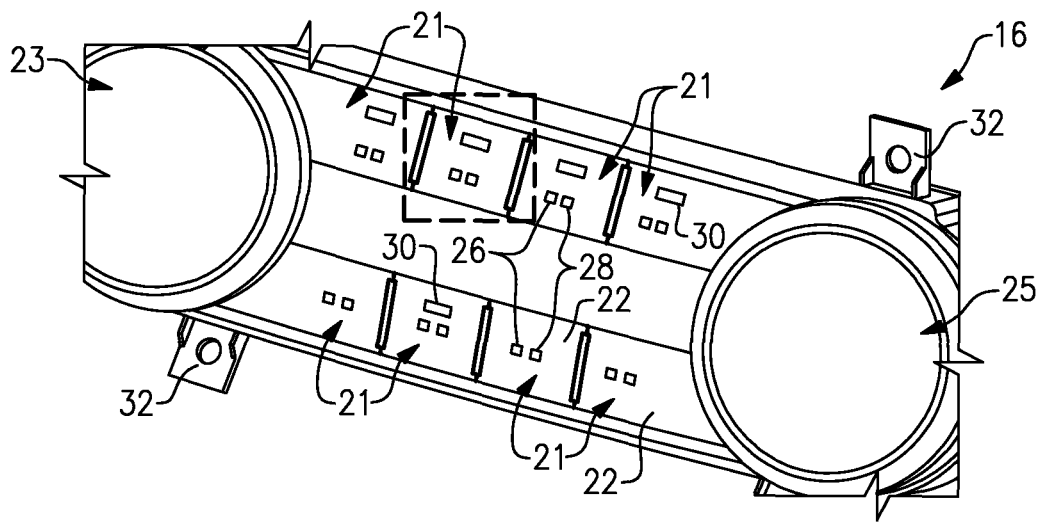
FIG. 2 illustrates an example vehicle component including multiple switches.
Figure 3:
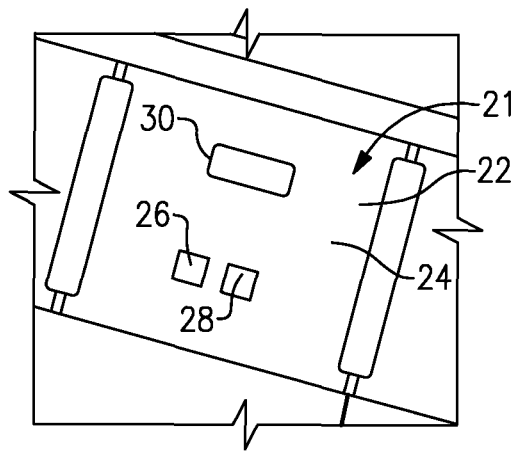
FIG. 3 illustrates an enlarged view of the example vehicle component of FIG. 1.

FIGS. 2 and 3 illustrate the example vehicle component 16 for use in the interior compartment 12 of the vehicle 10. The vehicle component 16 includes multiple switches 21 arranged into rows with rotary dial switches 25 on opposite ends of the vehicle component 16. The switches 21 may be used to turn on or off or vary the settings of the safety system, the temperature system, or the entertainment system in the vehicle 10.

The switches 21 include a button 22 having a contact surface 24 with at least one negative conductor 26 and at least one positive conductor 28 located on the contact surface 24. Some of the switches 21 may include a visual indicator 30 on the contact surface 24 of the button 22 to indicate the status of the switch 21. The vehicle component 16 includes multiple fasteners 32 for attaching the vehicle component 16 to the center stack 14 on the dash 18.

FIG. 4 illustrates schematic view of a switch assembly 40. The switch assembly 40 includes the switch 21, a microprocessor 42, an electrical system 44 with a positive electrical source, and a sensor 46. In the illustrated example, the button 22 is formed of a substrate 23, such as plastic, that electrically isolates the negative conductor 26 from the positive conductor 28 such that current cannot flow through the button 22 between the negative conductor 26 and the positive conductor 28. The positive and negative conductors 26 and 28 are rectangular in cross section and extend from the contact surface 24 to a bottom wall 50 on an opposite side of the button 22 from the contact surface 24.

The negative conductor 26 is in electrical communication with a ground 52. The positive conductor 28 is in electrical communication with the electrical system 44 when a switch 54 located between the positive conductor 28 and the electrical system 44 is closed by a signal sent from the microprocessor 42.

The switch assembly 40 provides haptic feedback to a user 56 in the form of an electrical stimulation when the user 56 contacts the negative conductor 26 and the positive conductor 28 on the contract surface 24 of the button 22. When the user 56 contacts the button 22, the sensor 46 sends a signal to the microprocessor 42 that the user 56 is in contact with the button 22. In one example, the sensor 46 is a capacitive sensor that senses a change in capacitance when the user 56 contacts the button 22 that is measured by the microprocessor 42 to determine that the user 56 is contacting the button 22.

Once the microprocessor 42 receives the signal from the sensor 46 that the user 56 is in contact with the button 22, the microprocessor 42 sends a signal to the electrical system 44 and closes the switch 54 to direct a current to the positive conductor 28. The current is able to transfer from the positive conductor 28 to the negative conductor 26 and into the ground 52 because a finger of the user 56 completes the circuit between the negative and positive conductors 26 and 28 such that the current travels through the user 56. The current traveling through the user 56 provides an electrical stimulation felt by the user 56 confirms that the switch 21 has been properly engaged.

FIG. 5 illustrates another example switch 121 that is similar to the switch 21 except where discussed below or shown in the Figures. The switch 121 includes a button 122 having a contact surface 124 with alternating negative conductors 126 and positive conductors 128 separated from each other by a substrate 123 of the button 122.

The negative and positive conductors 126 and 128 extend substantially the entire width of the button 122 between opposite sides 122*a* and 122*b* of the button 122. Opposite ends of the negative and positive conductors 126 and 128 are covered by the substrate 123 so that the negative and positive conductors 126 and 128 do not protrude out of the opposite sides 122*a* and 122*b* of the button 122.

As shown in FIG. 6, the positive and negative conductors 126 and 128 are rectangular in cross section and extend from the contact surface 124 to a bottom wall 150 of the button 122. The negative conductors 126 have a width D1 and the positive conductors 128 have a width D2. In the illustrated example, the width D1 is approximately equal to the width D2. However, the width D1 could vary between negative conductors 126 and the width D2 could vary between positive conductors 128. Alternatively, the width D2 could be larger than the width D2 or the width D1 could be smaller than the width D2. A sensor 146 is located adjacent the bottom wall 150 of the button 122.

FIG. 7 illustrates another example switch 221 that is similar to the switch 21 except where discussed below or shown in the Figures. The switch 221 includes a cylindrical button 222 with a contact surface 224 having alternating negative and positive conductors 226 and 228 separated from each other by a substrate 223. The negative and positive conductors 226 and 228 and the substrate 223 are individual hollow cylindrical rings that form the complete button 222. In the illustrated example, the radially innermost member is the negative conductor 226 forming a solid cylinder. However, the positive conductor 228 or the substrate 223 could form the innermost member depending on the sequence of the negative and positive conductors 226 and 228 and the quantity of the negative and positive conductors 226 and 228.

As shown in FIG. 8, the negative and positive conductors 226 and 228 are rectangular in cross section and extend from the contact surface 224 to a bottom wall 250 of the button 222. The negative conductors 226 have a width D3 and the positive conductors 228 have a width D4. In the illustrated example, the width D3 of the radially outermost conductor is greater than the width D4 of a radially inner positive conductor 228 and a width D5 of a radially inner negative conductor 226. The widths D4 and D5 are approximately equal. However, the widths D3, D4, and D5 could be approximately equal. Alternatively, the widths D3, D4, and D5 could vary having a decreasing width moving radially inward. A sensor 246 is located adjacent the bottom wall 250 of the button 222.

FIG. 9 illustrates another example switch 321 that is similar to the switch 21 except where discussed below or shown in the Figures. The switch 321 includes a button 322 with a contact surface 324 having alternating columns of cylindrical negative and positive conductors 326 and 328 separated from each other by a substrate 323. Alternatively, the button 322 could include alternating rows or a checker board of negative and positive conductors 326 and 328.

As shown in FIG. 10, the positive and negative conductors 326 and 328 are rectangular in cross section and extend from the contact surface 324 to a bottom wall 350 of the button 322. A sensor 346 is located adjacent the bottom wall 350 of the button 322. The negative conductors 326 have a width or diameter D6 and the positive conductors 328 have a width or diameter D7. In the illustrated example, the width D6 is approximately equal to the width D7. Alternatively, the width D6 could be larger than the width D7 or the width D6 could be smaller than the width D7.

The preceding description is exemplary rather than limiting in nature. Variations and modifications to the disclosed examples may become apparent to those skilled in the art that do not necessarily depart from the essence of this disclosure. The scope of legal protection given to this disclosure can only be determined by studying the following claims.

What is claimed is:

1. A switch comprising:
    a substrate having a non-conductive contact area on a first face;
    a first negative polarity conductor located in the substrate and extending onto the contact area;
    a second positive polarity conductor located in the substrate and extending onto the contact area; and
    a sensor configured to detect when a user makes a direct electrical contact with both the first negative polarity conductor and the second positive polarity conductor in the contact area.

2. The switch of claim 1, wherein the sensor is located on a second face of the substrate opposite the first face.

3. The switch of claim 2, wherein the first negative polarity conductor and the second positive polarity conductor extend from the first face of the substrate to a second face of the substrate.

4. The switch of claim 1, wherein the first negative polarity conductor is configured to be electrically connected to a reference potential.

5. The switch of claim 4, wherein the second positive polarity conductor is configured to be connected to a positive electrical potential.

6. The switch of claim 5, wherein the at least one first conductor and the at least one second conductor extend across a width of the substrate from a first edge of the substrate to a second opposite edge of the substrate.

7. The switch of claim 5, wherein the at least one first conductor forms a first ring and the at least one second conductor forms a second ring, the first ring radially spaced from the second ring.

8. The switch of claim 5, wherein the at least one first conductor is cylindrical and extends from the first face to a second face of the substrate and the at least one second conductor is cylindrical and extends from the first face to the second face.

9. The switch of claim 1, further comprising a microprocessor, wherein the sensor is configured to send a signal to a microprocessor when the user makes the direct electrical contact with both the first negative polarity conductor and the second positive polarity conductor in the contact area.

10. The switch of claim 9, wherein the microprocessor is configured to direct a current from an electrical power source to a reference potential through the first negative polarity conductor and the second positive polarity conductor when a portion of the user's body completes an electrical connection between the first negative polarity conductor and the second positive polarity conductor.

11. An automotive component comprising:
- a plurality of switch assemblies for controlling at least one vehicle parameter, each of the plurality of switch assemblies including:
    - a substrate having a contact area on a first face;
    - a first conductor located in the substrate extending onto the contact area;
    - a second conductor located in the substrate extending onto the contact area;
    - a sensor configured to detect when a user contacts both the first conductor and the second conductor in the contact area; and
    - a microprocessor in communication with the sensor to determine when a user makes a direct electrical connection between the first and second conductors in the the contact area.

12. The component of claim 11, further comprising an electrical power source connectable to one of the second conductor or the first conductor.

13. The component of claim 12, wherein the other of the second conductor or the first conductor is in electrical communication with a reference potential.

14. The component of claim 11, further comprising an electrical power source, wherein the sensor is configured to send a signal to the microprocessor when the user makes a direct electrical connection between the first and second conductors in the contact area.

15. The component of claim 14, wherein the microprocessor is configured to direct a current from the electrical power source to a ground through the first conductor and the second conductor when a portion of the user's body completes the circuit between the first conductor and the second conductor.

16. A method of operating a switch comprising
- a) grounding a first conductor located on a contact surface of a button to a ground;
- b) connecting an electrical power source to a second conductor located on the contact surface of the button;
- c) determining when a user contacts the button with a sensor;
- d) sending an electrical current to the second conductor when the user contacts the button;
- e) completing a circuit between the first conductor and the second conductor when the user contacts the button;
- wherein the sensor is configured to send a signal to a microprocessor when the user contacts the contact surface, the microprocessor being configured to direct the electrical current from the electrical power source to the ground through the first conductor and the second conductor when a portion of the user's body completes the circuit between the first conductor and the second conductor.

* * * * *